(12) United States Patent
Mimberg

(10) Patent No.: US 7,532,480 B1
(45) Date of Patent: May 12, 2009

(54) POWER DELIVERY FOR ELECTRONIC ASSEMBLIES

(75) Inventor: Ludger Mimberg, San Jose, CA (US)

(73) Assignee: nVidia Corporation, Santa Clara, CA (US)

( * ) Notice: Subject to any disclaimer, the term of this patent is extended or adjusted under 35 U.S.C. 154(b) by 47 days.

(21) Appl. No.: 11/611,038

(22) Filed: Dec. 14, 2006

(51) Int. Cl.
*H05K 7/20* (2006.01)

(52) U.S. Cl. ............... 361/721; 361/719; 361/790; 257/706; 257/707; 257/712; 257/713; 257/723

(58) Field of Classification Search ............ None
See application file for complete search history.

(56) References Cited

U.S. PATENT DOCUMENTS

| | | | | |
|---|---|---|---|---|
| 5,390,078 A | * | 2/1995 | Taylor ................. | 361/721 |
| 5,548,161 A | * | 8/1996 | Hirano et al. ........... | 257/722 |
| 5,883,426 A | * | 3/1999 | Tokuno et al. .......... | 257/686 |
| 5,969,944 A | * | 10/1999 | Borkar et al. ........... | 361/699 |
| 6,014,313 A | * | 1/2000 | Hesselbom ............ | 361/704 |
| 6,297,960 B1 | * | 10/2001 | Moden et al. ........... | 361/719 |
| 6,421,244 B1 | * | 7/2002 | Shinohara et al. ....... | 361/736 |
| 6,426,877 B1 | * | 7/2002 | Baba ................... | 361/760 |
| 6,791,832 B2 | * | 9/2004 | Budny et al. .......... | 361/687 |
| 6,815,254 B2 | * | 11/2004 | Mistry et al. .......... | 438/108 |
| 6,862,186 B2 | * | 3/2005 | Belady et al. .......... | 361/721 |
| 7,002,805 B2 | * | 2/2006 | Lee et al. .............. | 361/704 |
| 7,180,165 B2 | * | 2/2007 | Ellsberry et al. ........ | 257/686 |
| 7,205,647 B2 | * | 4/2007 | Karnezos ............... | 257/686 |
| 7,242,081 B1 | * | 7/2007 | Lee .................... | 257/686 |
| 7,336,490 B2 | * | 2/2008 | Harris et al. .......... | 361/704 |
| 2004/0080036 A1 | * | 4/2004 | Chang et al. .......... | 257/686 |
| 2004/0089943 A1 | * | 5/2004 | Kirigaya et al. ........ | 257/723 |

* cited by examiner

*Primary Examiner*—Boris L Chervinsky
(74) *Attorney, Agent, or Firm*—Berkeley Law & Technology Group, LLP

(57) ABSTRACT

Embodiments of methods, apparatuses, devices, and/or systems for power delivery for electronic assemblies are disclosed.

20 Claims, 5 Drawing Sheets

POWER DELIVERY FOR ELECTRONIC ASSEMBLIES

BACKGROUND

This disclosure is related to power delivery for electronic assemblies, such as a printed circuit board (PCB) having one or more integrated circuit (IC) devices disposed thereon.

As circuit density of IC devices continues to increase, delivery of high currents to IC devices becomes more critical. IC devices may include, for example, microprocessors, such as graphic processing units (GPU), central processing units (CPU), digital signal processors (DSP), and application specific integrated circuits (ASIC), as just a few examples. IC devices such as these may be disposed on a PCB to form an electronic assembly. Electronic assemblies may comprise, for example, graphics cards, motherboards and the like. Various techniques may currently be used to deliver high currents to an IC device of an electronic assembly. These techniques may include increasing copper layers of the PCB, or increasing PCB dimensions, for example. However, design constraints may limit the applicability of these techniques.

BRIEF DESCRIPTION OF THE DRAWINGS

Subject matter is particularly pointed out and distinctly claimed in the concluding portion of the specification. The claimed subject matter, however, both as to organization and method of operation, together with objects, features, and advantages thereof, may best be understood by reference of the following detailed description when read with the accompanying drawings in which:

DETAILED DESCRIPTION

Figure 1:
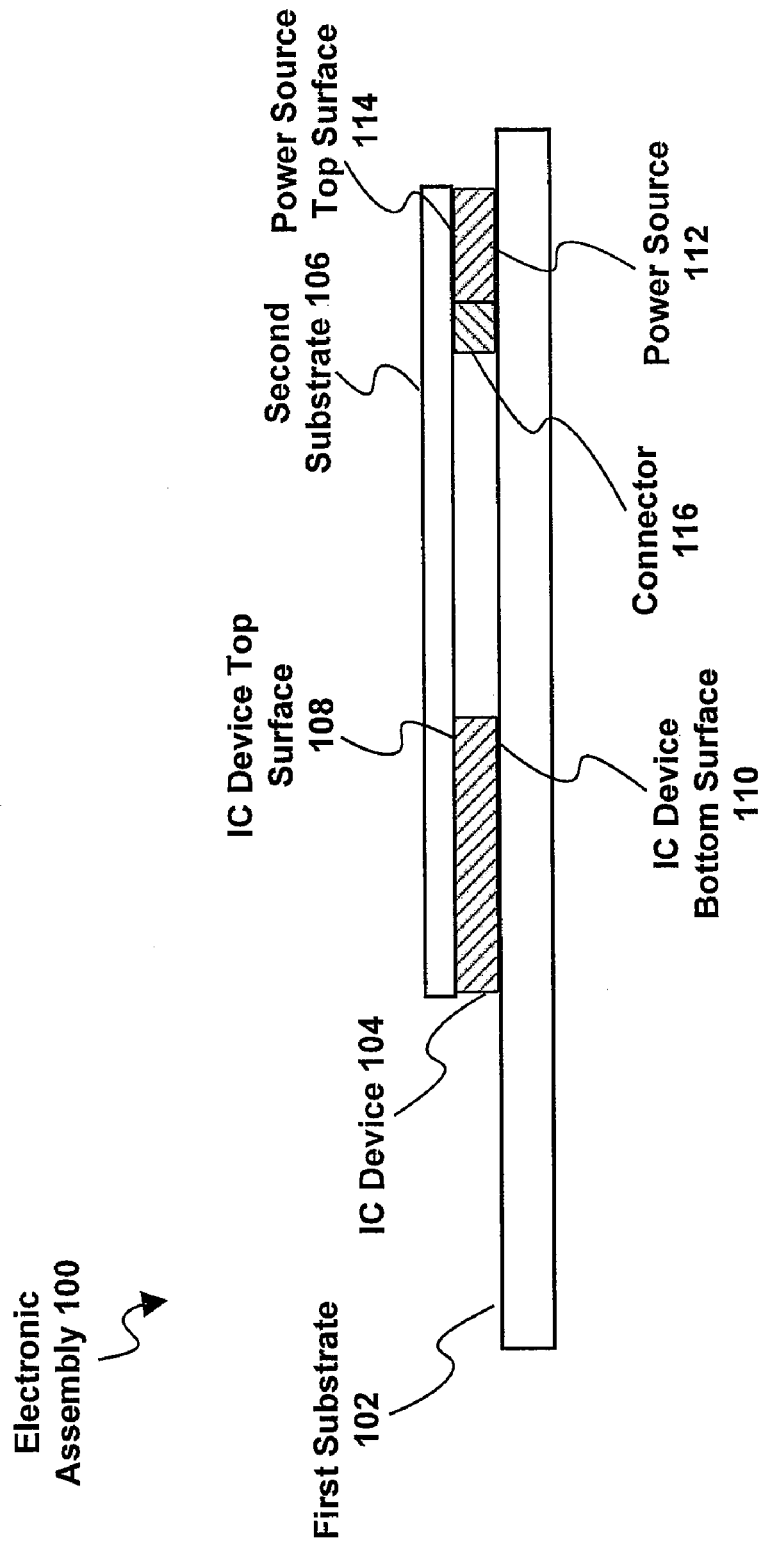
FIG. 1 is a cross sectional view of one embodiment of an electronic assembly.

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail so as not to obscure claimed subject matter.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" and/or "an embodiment" in various places throughout this specification are not necessarily all referring to the same embodiment. Furthermore, the particular features, structures, and/or characteristics may be combined in one or more embodiments.

Unless specifically stated otherwise, as apparent from the following discussion, it is appreciated that throughout this specification discussions utilizing terms such as "process-ing," "computing", "calculating", "selecting", "forming", "enabling", "providing", "sending,", "receiving", "determining", "detecting" and/or the like refer to the actions and/or processes that may be performed by a computing platform, such as a computer or a similar electronic computing device, that manipulates and/or transforms data represented as physical, electronic and/or magnetic quantities and/or other physical quantities within the computing platform's processors, memories, registers, and/or other information storage, transmission, reception and/or display devices. Accordingly, a computing system refers to a system or a device that includes the ability to process and/or store data in the form of signals. Thus, a computing system, in this context, may comprise hardware, software, firmware and/or any combination thereof. Further, unless specifically stated otherwise, a process as described herein, with reference to flow diagrams or otherwise, may also be executed and/or controlled, in whole or in part, by a computing system.

In the following description and/or claims, the terms "coupled", "connected" and derivatives thereof may be used. In particular embodiments, connected may be used to indicate that two or more elements are in direct physical and/or electrical contact. Coupled may mean that two or more elements are in direct physical and/or electrical contact, and may also mean that two or more elements may not be in direct physical and/or electrical contact but may cooperate and/or interact with one another.

An electronic assembly may comprise one or more integrated circuit (IC) devices coupled to a substrate. The substrate, in at least one embodiment, may comprise a printed circuit board (PCB). However, the claimed subject matter is not so limited, and a substrate may comprise any material or combination of materials suitable for implementation as part of an electronic assembly. However, in this context, the terms substrate and PCB may be used interchangeably. A PCB may be comprised of one or more layers, and may include conductive and/or non-conductive layers. For example, a PCB may comprise one or more layers of non-conductive material interleaved and/or laminated with one or more conductive circuit patterns and/or conductive layers. A PCB may comprise a rigid substrate or a flexible substrate, or combinations thereof. In addition to or instead of IC devices, an electronic assembly may comprise other types of electronic components such as memory devices, capacitors, resistors, connectors including input/output (I/O) connectors for coupling to external circuitry, and/or cables for coupling a PCB to electronic components, such as electronic components attached to the PCB or separate from the PCB, for example, but it is worthwhile to note that the claimed subject matter is not so limited. In at least one embodiment, one or more electronic assemblies may be coupled to form an electronic device. Examples of electronic devices may include, for example, computers, including desktop computers, laptop computers, servers, switches, and/or hubs, handheld devices, including digital cameras and cellular or wireless telephones, and may additionally include peripheral devices, including printers, monitors, and/or scanners, for example. Those skilled in the art will recognize, however, that particular embodiments are not limited in this respect, but may be applicable to any electronic assembly and/or electronic device that utilizes one or more electronic components such as IC devices, for example.

Referring now to FIG. 1, there is illustrated a cross sectional view of an example embodiment of an electronic assembly 100. Electronic assembly 100 includes a first substrate 102, IC device 104, second substrate 106, and power source 112. In this embodiment, IC device 104 may include a top surface 108 and a bottom surface 110. IC device 104 is electrically coupled to first substrate 102. For example, first substrate 102 may include conductive regions (not shown), such as contacts, traces, pads, plated through holes (PTH) or the like, which may cooperate with one or more conductive regions (not shown) formed on bottom surface 110 of IC device 104 to provide electrical connectivity therebetween. Alternatively, a socket (not shown) may be coupled to substrate 102. The socket may engage IC device 104 and provide electrical connectivity between first substrate 102 and IC device 104. Additionally, in this embodiment, IC device 104 is electrically coupled to second substrate 106. For example, second substrate 106 may include conductive regions (not shown) which may cooperate with one or more conductive regions (not shown) formed on top surface 108 of IC device 104 to provide electrical connectivity therebetween. As will be explained in more detail later, signals, such as power, ground and/or data signals may be provided to IC device 104 via first substrate 102 and/or second substrate 106. For example, any combination of power, ground and/or data signals may be provided via first substrate 102 and/or second substrate 106 in at least one embodiment.

Continuing with this embodiment, power source 112 is electrically coupled to first substrate 102. Power source 112 may be adapted to deliver power and/or ground signals to IC device 104 and/or one or more other electronic components (not shown) coupled to first substrate 102. Power and/or ground signals may be provided by use of conductive regions and/or conductive layers (not shown) of first substrate 102, which may form a first power path, for example. Additionally, power source 112 may be electrically coupled to second substrate 106 to form a second power path, and may be adapted to deliver power and/or ground signals to IC device 104 and/or one or more other electronic components (not shown) coupled to second substrate 106. For example, power source 112 may be electrically coupled to second substrate 106 via connector 116 and/or one or more conductive regions that may be formed on power source top surface 114. In one example, connector 116 may be electrically coupled to power source 112 and/or first substrate 102. Connector 116 may further be electrically coupled to second substrate 106, such that power may be provided to connector 116 via power source 106 and/or first substrate 102. Power may be provided to second substrate 106 via one or more conductive regions and/or conductive paths formed on connector 116, second substrate 106 and/or power source top surface 114. For example, second substrate 106 may include conductive regions (not shown) which may cooperate with one or more conductive regions or conductive paths formed on connector 116 and/or power source top surface 114 to provide electrical connectivity therebetween. Alternatively, connector 116 may be integrated with power source 112, such that power may be provided to connector 116 from power source 112, which may then be provided to second substrate 106. However, it is worthwhile to note that the claimed subject matter is not limited in this respect.

In an alternative embodiment, second substrate 106 may comprise a flexible substrate. Additionally, in another alternative embodiment, one or more cables and/or other types and categories of conductive media may be employed instead of or in addition to second substrate 106 to provide a second power path between power source 112 and IC device 104. The second power path may be employed to deliver power and/or ground signals from power source 112 to IC device 104 and/or one or more other electronic components coupled to first substrate 102. However, it is worthwhile to note that the claimed subject matter is not limited in this respect, and may comprise any method and/or apparatus of providing a second power source in accordance with one or more embodiments.

Furthermore, a heat dissipation device (not shown) may be coupled to top surface 108 of IC device 104 and/or may be coupled to second substrate 106. The heat dissipation device may comprise a heat sink and/or fan, and/or other types of active or passive thermal devices, although the claimed subject matter is not limited in this respect. The heat dissipation device may additionally be coupled to other components formed on substrate 102, such as one or more memory devices (not shown), although the claimed subject matter is not so limited. In one embodiment, when assembled, substrate 106 does not interfere with the coupling of a heat dissipation device to IC device 104, and, accordingly, may not increase the stack height of an electrical assembly. However, this will be explained in more detail later.

For this example embodiment, electronic assembly 100 may comprise a graphics card. Accordingly, in this example embodiment, substrate 102 comprises a PCB, IC device 104 comprises a graphics processing unit (GPU), and power source 112 may comprise a GPU power supply, although the claimed subject matter is not limiting in this respect. Additionally, although not illustrated, other IC devices and/or other electronic components may be disposed on first substrate 102. Furthermore, although electronic assembly 100 is shown with a particular configuration of electronic components, other embodiments are possible using any of a wide range of configurations. For example, embodiments may employ other IC devices such as one or more central processing units (CPU), digital signal processors (DSP), and/or application specific integrated circuit (ASIC), and may additionally employ other electronic components such as memory, including, for example, random access memory (RAM) such as one or more types of dynamic random access memory (DRAM), including synchronous dynamic random access memory (SDRAM) or dual data rate memory (DDR, DDR2), as just a few examples. Additionally, electronic assembly 100 may comprise any type of assembly that may employ electronic components coupled to a substrate, such as graphics cards, memory devices, motherboards, network interface cards, and the like. Further, the example embodiments described herein may be utilized in any of a wide range of electronic devices, such as devices mentioned previously. Additionally, numerous types and categories of heat dissipation device may be employed in alternative embodiments. For example, although the claimed subject matter is not so limited, heat dissipation devices may comprise heat spreaders, such as integrated heat spreaders (IHS), heat slugs, and/or heat sinks, such as finned or pinned heat sinks, and may additionally comprise fans, refrigeration components, and/or thermoelectric components, as just a few examples.

Figure 2:
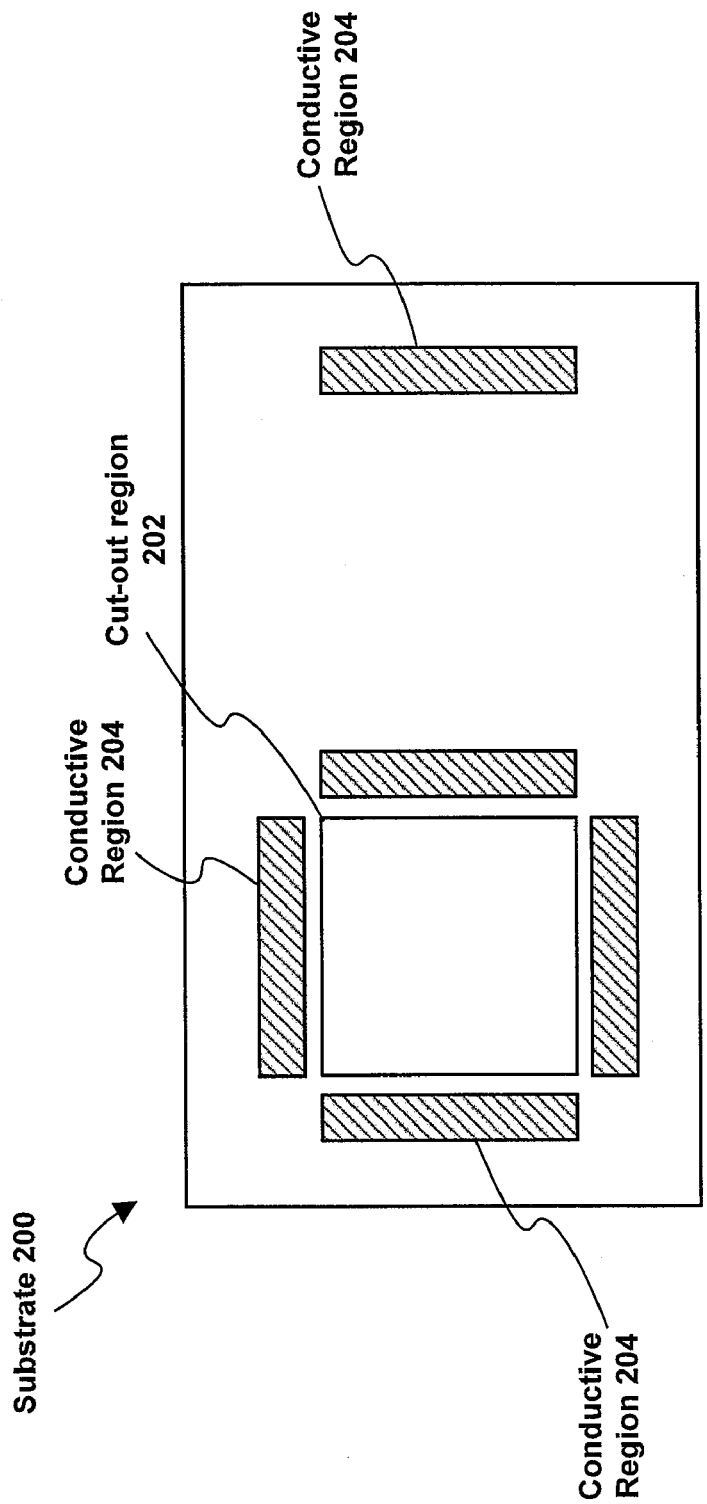
FIG. 2 is a top view of a portion of one embodiment of an electronic assembly.

FIG. 2 is a top view of an example embodiment of a substrate 200 that may be employed as part of an electronic assembly, such as electronic assembly 100 of FIG. 1. For example, substrate 200 may be employed in a manner such as described with reference to second substrate 106 of FIG. 1. In this embodiment, substrate 200 may comprise a PCB, although, as mentioned previously, the claimed subject matter is not so limited. Substrate 200 may be comprised of one or more layers, such as conductive and/or non-conductive layers, and may include conductive regions formed on one or more surfaces. For example, conductive regions 204 may be formed on a surface of substrate 200. Conductive regions 204 may comprise connectors, traces, pads, PTHs, or the like. Furthermore, one or more conductive regions 204 may be electrically coupled with one another. In operation, conductive regions may be adapted to deliver power, ground and/or data signals, such as between a power source and an IC device, as described with reference to FIG. 1, and/or I/O circuitry and an IC device, for example.

Continuing with this embodiment, substrate 200 may include cut-out region 202, although in other embodiments no cut-out region may be employed. Cut-out region 202 may enable a heat dissipation device (not shown) to couple to an IC device (not shown) when substrate 200 is implemented as part of an electronic assembly, for example. Cut-out region 202 may further enable substrate 200 to electrically couple with an IC device, while not interfering with a heat dissipation device coupled to IC device. Additionally, other cut-out regions (not shown) may be formed on substrate 200, to allow other components of an electronic assembly to couple with a heat dissipation device. For example, cut-out regions for one or more memory devices may be formed on substrate 202, in one or more embodiments, and may depend on the configuration of an electronic assembly that may employ substrate 200, for example. Cut-out regions such as cut-out region 202 may provide the capability of maintaining a particular stack height when substrate 200 is implemented in an electronic assembly, for example. Alternatively, a heat dissipation device may be coupled to a second substrate (not shown), and the second substrate may be adapted to provide heat transfer between an IC device and a heat dissipation device. Additionally, substrate 200 may include insulated or non-conductive regions. For example, one side of substrate 200 may include conductive regions, and an opposite side may be insulated. In one exemplary embodiment, substrate 200 may include two conductive layers, which may include power and ground paths. The power path may include one of more of the conductive regions 204. Additionally, the ground path may include conductive regions formed on the opposite side of substrate 200 (not shown), and/or the opposite side of substrate 200 may be insulated, for example. A substrate such as this may be employed in an electronic assembly such as described with reference to FIG. 3.

Figure 3:
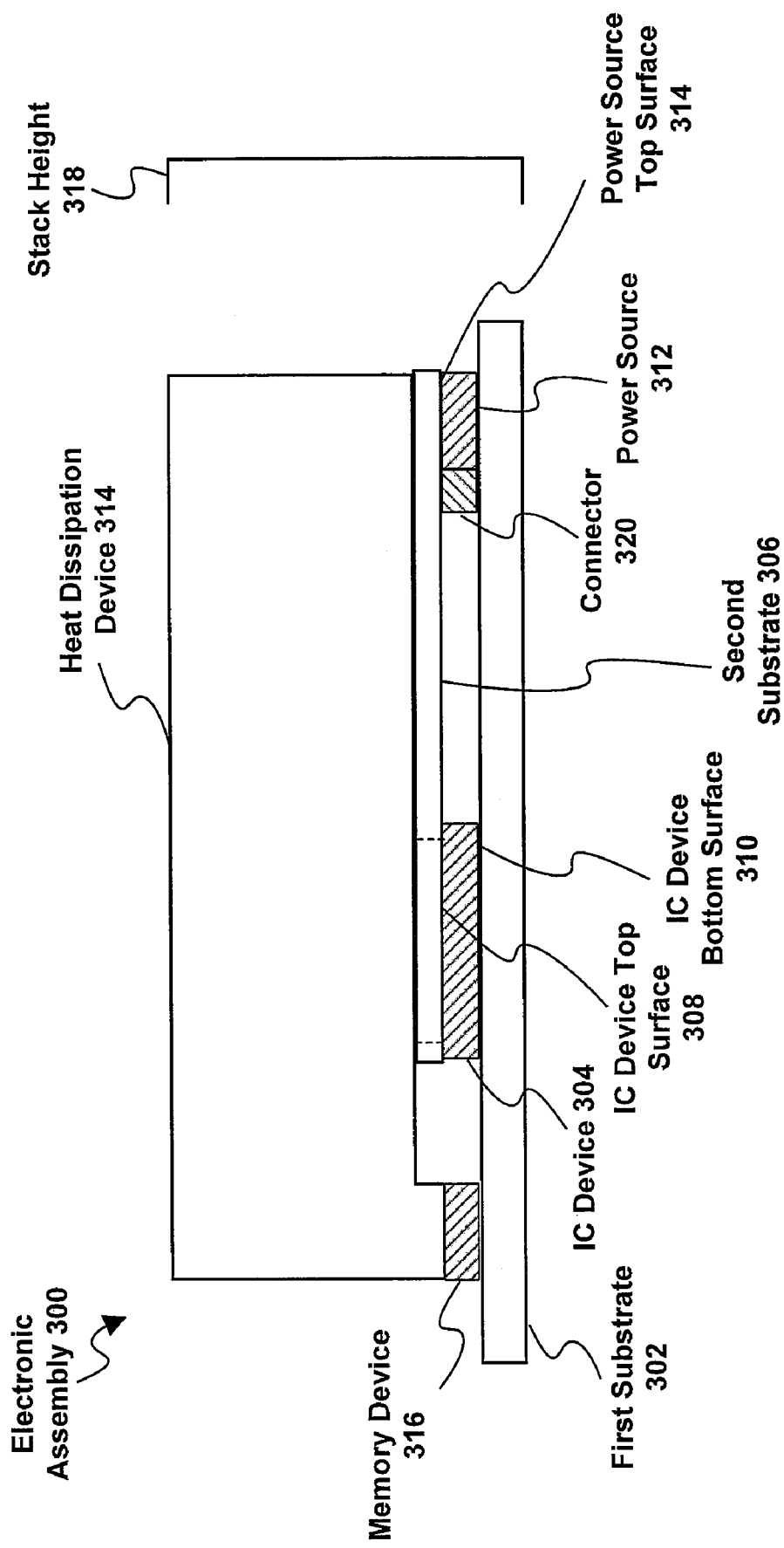
FIG. 3 is a cross sectional view of one embodiment of an electronic assembly.

FIG. 3 is a cross sectional view of an example embodiment of an electronic assembly 300. Electronic assembly 300 includes a first substrate 302, IC device 304, second substrate 306, memory device 316, and power source 312. IC device 304 includes top surface 308 and bottom surface 310. In this example embodiment, IC device 304 may comprise a GPU, and, accordingly, electronic assembly 300 may comprise a graphics card, and may have a stack height 318. IC device 304 is electrically coupled to first substrate 302 such as by use of conductive regions (not shown), which may cooperate with one or more conductive regions (not shown) formed on bottom surface 310 of IC device 304 to provide electrical connectivity therebetween. Alternatively, a socket (not shown) may be coupled to substrate 302 to engage IC device 304. Additionally, in this embodiment, IC device 304 is electrically coupled to second substrate 306. For example, second substrate 306 may include conductive regions (not shown) which may cooperate with one or more conductive regions (not shown) formed on top surface 308 of IC device 304.

Continuing with this embodiment, power source 312 is electrically coupled to first substrate 302. Power source 312 may be adapted to deliver power and/or ground signals to one or more components coupled to first substrate 302, such as by use of conductive layers (not shown) of first substrate 302 which may form a conductive path, for example. Additionally, power source 312 may be electrically coupled to second substrate 306, such as via connector 320 and/or conductive regions formed on power source top surface 314, for example. Second substrate 306 may be configured as described with reference to substrate 200 of FIG. 2, and may include conductive regions (not shown) which may cooperate with one or more conductive regions (not shown) formed on conductor 320 and/or power source top surface 314, for example.

Additionally, power source 312 may be electrically coupled to second substrate 306 via connector 320. In this example, connector 320 may be electrically connected to power source 312 and/or first substrate 302. Connector 320 may further be electrically connected to second substrate 306, such that power may be provided to connector 320 via power source 312 and/or first substrate 302. Power may be provided to second substrate 306 via one or more conductive regions and/or conductive paths formed on connector 320 and second substrate 306. For example, second substrate 306 may include conductive regions (not shown) which may cooperate with one or more conductive regions or conductive paths formed on connector 320 to provide electrical connectivity therebetween. Alternatively, connector 320 may be integrated with power source 312, such that power may be provided to connector 320 from power source 312, which may then be provided to second substrate 306.

In an alternative embodiment, second substrate 306 may comprise a flexible substrate. Additionally, in another alternative embodiment, one or more cables and/or other types and categories of conductive media may be employed instead of or in addition to second substrate 306 to provide a second power path between power source 312 and IC device 304, for example. The second power path may be employed to deliver power and/or ground signals from power source 312 to IC device 304 and/or one or more other electronic components coupled to first substrate 302. However, it is worthwhile to note that the claimed subject matter is not limited in this respect, and may comprise any method and/or apparatus of providing a second power source in accordance with one or more embodiments.

Furthermore, heat dissipation device 314 is coupled to top surface 308 of IC device 304 and memory 316, and may comprise a heat sink and/or fan, and/or other types of active or passive thermal devices, as explained previously. Alternatively, heat dissipation device 314 may be coupled to second substrate 306, and second substrate 306 may be adapted to provide heat transfer between IC device 304 and heat dissipation device 314. However, although electronic assembly 300 is shown with a particular configuration of electronic components, other embodiments are possible using any of a wide range of configurations.

For this example embodiment, power and/or ground signals are delivered to IC device 304 via a power path of first substrate 302 and/or a power path of second substrate 306, although other embodiments are possible wherein power and/or ground signals may be delivered solely via second substrate 306, which would allow first substrate 302 to have dedicated data signal channels for IC device 304, and substrate 306 to have dedicated power channels, for example.

Providing power to IC device via first substrate 304 and second substrate 306 may provide the benefit of providing additional power to IC device 302 to meet the power requirements of high current devices. For example, GPU current demands that may exceed 80-120 A may benefit from multiple or alternate power channels, for example. Additionally, this may result in reduced resistance losses such as by increasing available conductive paths and/or reducing a power path resistance. Additionally, a substrate such as second substrate 306 may have cut-out regions to allow IC devices and/or other devices to couple with heat dissipation devices, without increasing the stack height 318 of the electronic assembly. For example, a heat dissipation device may have standoffs to clear contact regions of a top surface of a GPU, and a substrate such as second substrate 306 may be electrically coupled to one or more contacts on the top surface of a GPU, while not interfering with the heat dissipation device. This may result in the formation of an electrical assembly having an alternative power path, while conforming with design constraints such as a stack height, for example. Additionally, first substrate 302 and second substrate 306 may each include a signal path for IC device 304, a combination of signal paths and power paths, and/or variations thereof. This may provide the advantage of design flexibility such as by providing multiple alternate signal and power paths for IC device 304, for example.

Figure 4:
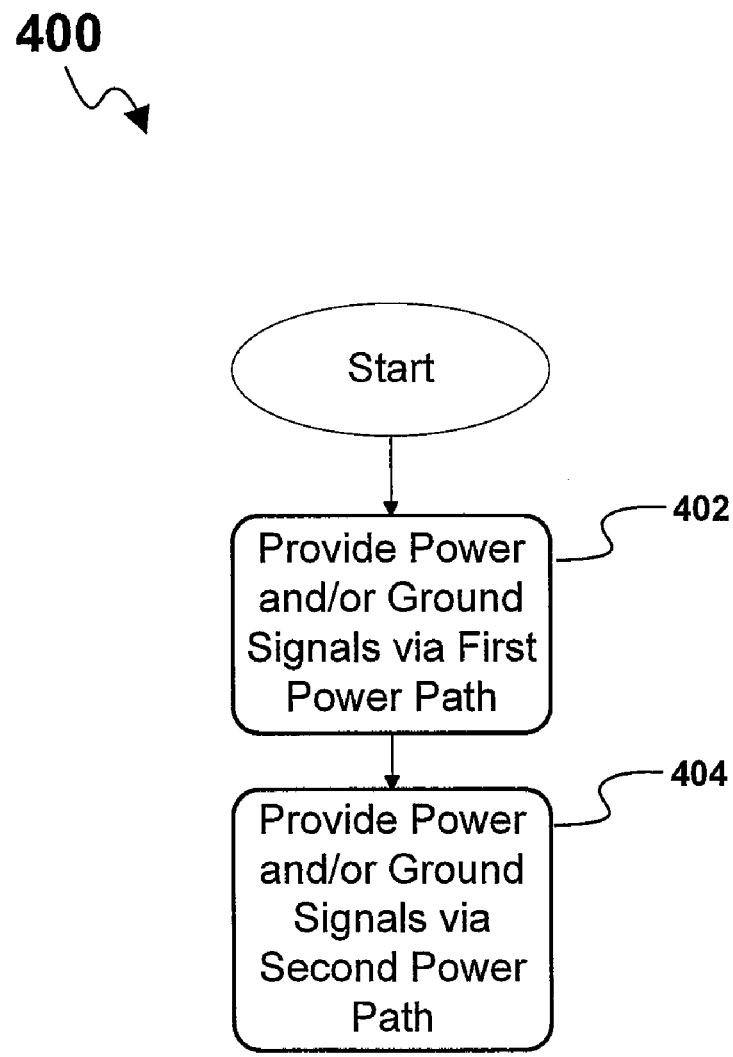
FIG. 4 is a block diagram illustrating a method of providing power to an electronic component disposed on an electronic assembly, in accordance with at least one embodiment.

FIG. 4 illustrates a flow diagram of an example embodiment of a method of proving power and/or ground signals to an IC device disposed on a substrate. At block 402, power and/or ground signals are provided from a power source to an IC device via a first conductive path. At block 404, power and/or ground signals are provided from a power source to an IC device via a second conductive path. Power and/or ground signals may be provided from a power source, such as a power supply that may be disposed on a substrate. The power and/or ground signals may be provided via the first and second conductive paths substantially simultaneously, in order to meet power requirements of a high current IC device such as a GPU, for example. The first and second conductive paths may comprise a first and a second substrate, respectively, that may be electrically coupled to the IC device. Additionally, one or more data signal paths may be formed in the first and second substrates. One or more of the previously described embodiments may employ the method of providing power, ground and/or data signals, and the claimed subject matter is not limited in this respect. Additionally, the order in which the particular operations are presented does not necessarily imply a particular order of operation, and may comprise fewer operations or additional intervening, substitute, or subsequent operations.

Figure 5:
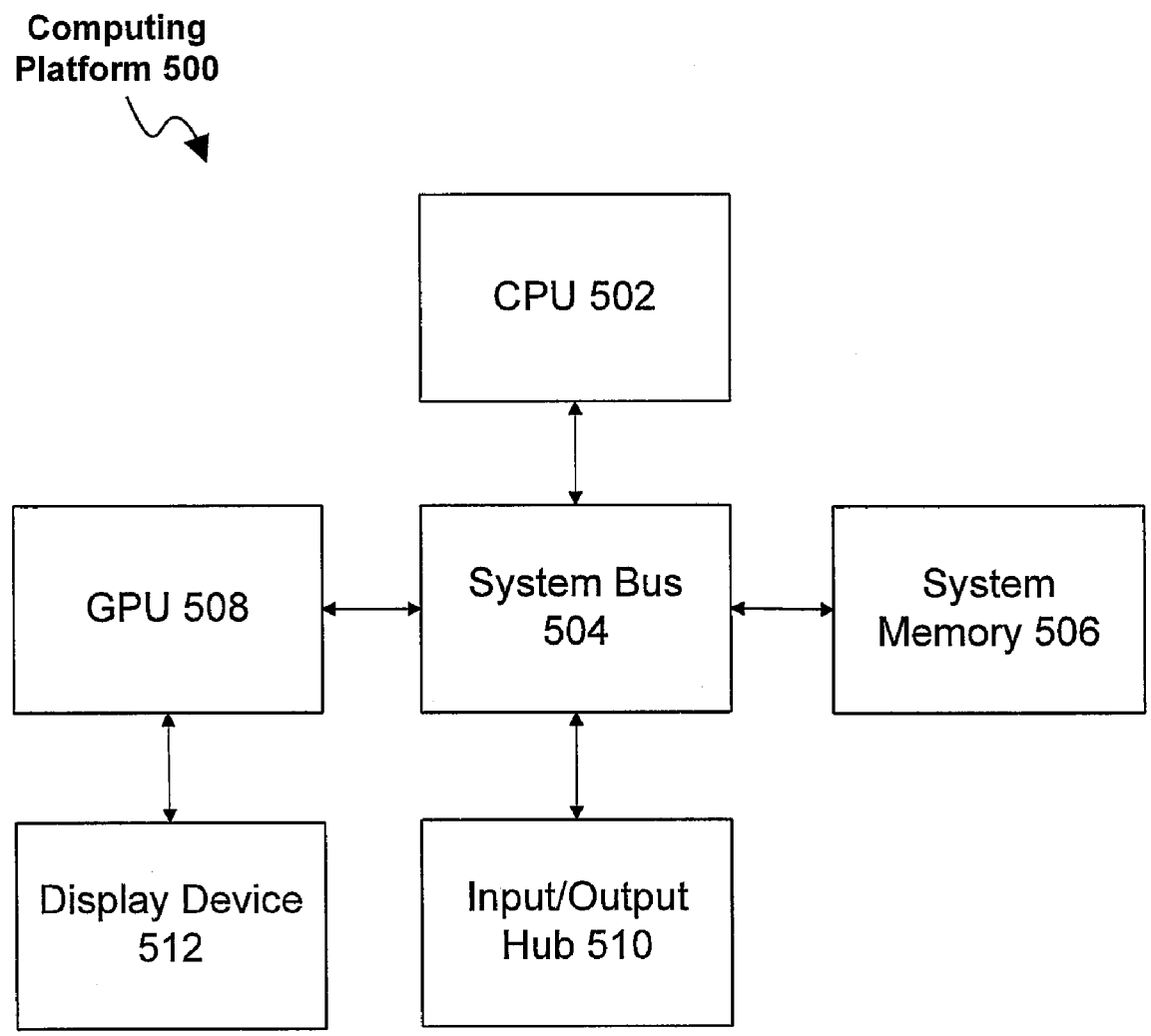
FIG. 5 is a block diagram of an example embodiment of a computing platform.

FIG. 5 is a block diagram of an example embodiment of a computing platform 500. Computing platform 500 may comprise a CPU 502, and a system bus 504 coupled to CPU 502. System bus 504 may be further coupled to a system memory 506, to a GPU 508, and/or to an input/output hub 510. GPU 508 may be further coupled to a display device 512, which may comprise a liquid crystal display (LCD), a projector or a cathode-ray tube (CRT) display, for example. Also coupled to GPU 508 may be a graphics memory, which may be formed integrally with GPU 508 on a PCB, for example. Computing platform 500 may also comprise one or more storage medium reading devices (not shown), which may be coupled to input/output hub 510, for example.

Although example computing platform 500 is shown with a particular configuration of components, other embodiments are possible using any of a wide range of configurations. For example, embodiments are possible where a plurality of CPUs and/or GPUs are employed. Further, the example embodiments described herein may be used in any of a wide range of electronic devices, such as those described previously. Furthermore, computing platform 500 may include assemblies and/or components described with reference to any of the previously described embodiments, such as a graphics card in accordance with one or more of the aforementioned embodiments.

In the preceding description, various aspects of the claimed subject matter have been described. For purposes of explanation, specific numbers, systems and/or configurations were set forth to provide a thorough understanding of the claimed subject matter. However, it should be apparent to one skilled in the art having the benefit of this disclosure that the claimed subject matter may be practiced without the specific details. In other instances, well-known features were omitted and/or simplified so as not to obscure the claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of the claimed subject matter.

The invention claimed is:

1. An apparatus, comprising:
a first substrate;
an integrated circuit device disposed on the first substrate, the integrated circuit device having a top and a bottom surface, wherein the integrated circuit device bottom surface is electrically coupled to the first substrate, the first substrate to provide power and/or ground signals to the integrated circuit device;
a connector disposed on the first substrate, the connector comprising electrical connections to additional power and/or ground signals; and
a second substrate comprising a printed circuit board electrically coupled to the connector and further electrically coupled to the top surface of the integrated circuit device, the second substrate to provide the additional power and/or ground signals to the integrated circuit device.

2. The apparatus of claim 1, wherein the first substrate and the connector are electrically coupled to one or more power sources.

3. The apparatus of claim 1, further comprising a heat dissipation device coupled to the top surface of the integrated circuit device.

4. The apparatus of claim 3, wherein the heat dissipation device comprises one or more of a fan, a refrigeration component, a thermoelectric component, a heat spreader including an integrated heat spreader, a heat slug, and/or a heat sink.

5. The apparatus of claim 1, wherein the first and second substrates further comprise one or more data signal paths to the integrated circuit device.

6. The apparatus of claim 1, wherein the second substrate comprises a cut-out region to enable a heat dissipation device to be coupled to the top surface of the integrated circuit device, the cut-out region further to enable the second substrate and the heat dissipation device to couple to the integrated circuit device without interfering with one another.

7. The apparatus of claim 1, further comprising one or more electronic components coupled to the top surface of the first substrate.

8. The apparatus of claim 7, wherein the second substrate comprises a flexible substrate.

9. The apparatus of claim 8, wherein the one or more electronic components comprise one or more of a memory device, a digital signal processor, an application specific integrated circuit, a central processing unit, and/or a graphics processing unit.

10. A system, comprising:
a system bus;
a central processing unit coupled to the system bus; and
a graphics card, comprising:
a first substrate;
an integrated circuit device disposed on the first substrate, the integrated circuit device having a top and a bottom surface, wherein the integrated circuit device bottom surface is electrically coupled to the first substrate, the first substrate to provide power and/or ground signals to the integrated circuit device;

a connector disposed on the first substrate, the connector comprising electrical connections to additional power and/or ground signals; and a second substrate comprising a printed circuit board electrically coupled to the connector and further electrically coupled to the top surface of the integrated circuit device, the second substrate to provide the additional power and/or ground signals to the integrated circuit device.

11. The system of claim 10, wherein the first substrate and the connector are electrically coupled to a power supply disposed on the first substrate.

12. The system of claim 10, further comprising a heat dissipation device disposed on the top surface of the integrated circuit device, wherein the heat dissipation device comprises one or more of a fan, a refrigeration component, a thermoelectric component, a heat spreader including an integrated heat spreader, a heat slug, and/or a heat sink.

13. The system of claim 10, wherein the first and second substrates further comprise one or more data signal paths for the integrated circuit device.

14. The system of claim 10, wherein the second substrate comprises a cut-out region to enable a heat dissipation device to be coupled to the top surface of the integrated circuit device, the cut-out region further to enable the second substrate and the heat dissipation device to couple to the integrated circuit device without interfering with one another.

15. The system of claim 10, further comprising one or more electronic components coupled to the top surface of the first substrate.

16. The system of claim 10, wherein the second substrate comprises a flexible substrate.

17. The system of claim 15, wherein the one or more electronic components comprise one or more of a memory device, a digital signal processor, an application specific integrated circuit, a central processing unit, and/or a graphics processing unit.

18. An apparatus, comprising:
means for providing power and/or ground signals to an integrated circuit device via a first conductive path formed on a first substrate coupled to the integrated circuit device;
means for connecting a second substrate to the first substrate, said means for connecting to provide additional power and/or ground signals; and
means for providing said additional power and/or ground signals to the integrated circuit device via a second-conductive path formed on the second substrate, wherein the second substrate is coupled to the integrated circuit device, and wherein the second substrate comprises a printed circuit board.

19. The apparatus of clam 18, further comprising means for providing data signals via at least one of the first and second substrates.

20. The apparatus of claim 18, further comprising:
means for coupling a heat dissipation device to the integrated circuit device, neither of the first and the second substrates to interfere with the heat dissipation device.

* * * * *